(12) United States Patent
Prakash et al.

(10) Patent No.: US 10,312,886 B2
(45) Date of Patent: Jun. 4, 2019

(54) ASYNCHRONOUS CLOCK GATING CIRCUIT

(71) Applicant: INVECAS TECHNOLOGIES PVT. LTD., Hyderabad (IN)

(72) Inventors: Gyan Prakash, Hatia Ranchi (IN); Nidhir Kumar, Bangalore (IN)

(73) Assignee: INVECAS TECHNOLOGIES PVT. LTD, Hyderabad (IN)

( * ) Notice: Subject to any disclaimer, the term of this patent is extended or adjusted under 35 U.S.C. 154(b) by 0 days.

(21) Appl. No.: 15/573,907

(22) PCT Filed: Jun. 14, 2016

(86) PCT No.: PCT/IN2016/000154
§ 371 (c)(1),
(2) Date: Nov. 14, 2017

(87) PCT Pub. No.: WO2016/203491
PCT Pub. Date: Dec. 22, 2016

(65) Prior Publication Data
US 2018/0351537 A1    Dec. 6, 2018

(30) Foreign Application Priority Data

Jun. 16, 2015    (IN) .......................... 1276/CHE/2015

(51) Int. Cl.
*H03K 3/012*    (2006.01)
*H03K 5/135*    (2006.01)
*H03K 3/037*    (2006.01)
*H03K 19/00*    (2006.01)

(52) U.S. Cl.
CPC ............ *H03K 3/012* (2013.01); *H03K 3/037* (2013.01); *H03K 3/0375* (2013.01); *H03K 5/135* (2013.01); *H03K 19/0016* (2013.01)

(58) Field of Classification Search
CPC .......... H03K 5/003; H03K 4/06; H03K 3/012
See application file for complete search history.

(56) References Cited

U.S. PATENT DOCUMENTS 8,643,411 B1 *    2/2014   Goyal ............... H03K 19/0016
                                                        327/141
9,270,270 B2 *    2/2016   Cai .................. H03K 3/356052
9,419,590 B2 *    8/2016   Berzins ................ H03K 3/012

* cited by examiner

*Primary Examiner* — Hai L Nguyen
(74) *Attorney, Agent, or Firm* — Barry Choobin; Patent 360 LLC

(57) ABSTRACT

The present disclosure envisages an asynchronous clock gating circuitry and a method for designing the asynchronous clock gating circuitry. The asynchronous clock gating circuitry could be placed at the very beginning of the clock network, given its design and implementation logic. The asynchronous clock gating circuitry helps meet the timing requirement on the enable pin thereof. The asynchronous clock gating circuitry avoids cumbersome replication of cluck gating circuitry during physical implementation of the (circuit) design, and further helps reduce the power consumption levels in sequential circuits.

9 Claims, 5 Drawing Sheets

ASYNCHRONOUS CLOCK GATING CIRCUIT

CROSS REFERENCE TO RELATED APPLICATIONS

This Patent Application is a National Phase Application corresponding to the PCT Application No. PCT/IN2016/000154 filed on Jun. 14, 2016 with the title "ASYNCHRONOUS CLOCK GATING CIRCUIT". This Patent Application claims the priority of the Indian Provisional Patent Application No. 1276/CHE/2015 filed on Jun. 16, 2015 with the title "MULTI UTILITY CLOCK GATING CIRCUIT", the contents of which are included herein by the way of reference.

BACKGROUND

Technical Field

The present disclosure relates to electronic circuits. Particularly, the present disclosure relates to the design and implementation of integrated circuits. More particularly, the present disclosure relates to designing clock gating circuits.

Description of the Related Art

With the recent advancements in design and implementation of integrated electronic circuits, the emphasis has also been upon designing electronic circuits which bring about a reduction in power consumption and an increase in the overall efficiency of the semiconductor device which made operation using the said integrated circuit. One of the methods to bring about a reduction in the power consumption levels of a semiconductor device is to shut off the active clock inputs to the sequential blocks (circuits) thereof when (those sections/circuits are) not in use.

Sequential circuits typically have been the major contributors for power dissipation in the digital system since one of the inputs to sequential circuits is a clock which is switched on all the time. Further, since clock signal are heavily loaded most of the times and this phenomenon brings about an increase in the power dissipation. Further, to distribute the clock and to control the skew network, a clock network (also referred to as clock tree) incorporating clock buffers is constructed. The construction of clock tree with clock buffers makes a direct contribution to the increase in power consumption across the sequential circuits.

Clock gating is one of the conventional methods utilized to control and optimize the (electrical) power dissipated by a clock network and the corresponding sequential circuits, since in a typical semiconductor device, the clock network contributes significantly for power dissipation. One of the well known conventional techniques for saving electrical power in clock trees was to stop the clock fed into any idle modules thereof. The phenomenon of clock gating controls the switching of the clock network by selectively disabling the clock, whenever there has been no change in the state of a clock register.

Yet another conventional attempt towards reducing the power dissipation of sequential circuits involved using a pre-computation technique to generate a signal that controls the load enable pin of the flip flops in the data path. The control signal is typically derived by investigating the combinational blocks in the data path. However, the aforementioned technique is useful only if the outputs of the block can be pre computed (predicted) for certain input assignments.

Yet another conventional attempt towards reducing the power dissipation of sequential circuits involved the use of a latch based clock gating circuit in control-dominated designs. However, the drawback associated with this approach is that the additional latch based clock gating circuit when placed early in the clock tree to save clock tree power, has diminished timing budget for its setup time requirement. In order to improve the timing budget, plurality of latches are put later in the clock tree (near the sequential elements which receives gated clock). This approach defeats the purpose of saving the clock tree power, additional power is dissipated by plurality of lathes itself. In view of the foregoing, there was felt a need for an efficient and effective mechanism for gating the active clock edges and for ensuring improved power management and utilization in sequential circuits.

OBJECTS

An object of the present disclosure is to provide a multi-utility asynchronous clock gating circuitry.

Yet another object of the present disclosure is to provide a multi-utility asynchronous clock gating circuitry which could be placed at the beginning of the clock network.

One more object of the present disclosure is to provide a multi-utility asynchronous clock gating circuitry that helps meet the timing requirement on the enable pin thereof.

Still a further object of the present disclosure is to provide a multi-utility asynchronous clock gating circuitry that avoids cumbersome replication of clock gating circuitry during physical implementation of the design.

Yet another object of the present disclosure is to provide a multi-utility asynchronous clock gating circuitry that helps reduce the power consumption levels in sequential circuits.

SUMMARY

The present disclosure envisages an asynchronous clock gating circuitry and a method for designing the asynchronous clock gating circuitry. The clock gating circuitry envisaged by the present disclosure includes a double synchronizer which is responsive to a clock signal as well as an enable signal. The double synchronizer synchronizes the enable signal with clock domain corresponding to a gated clock signal, and subsequently generates a synchronized enable signal (also referred to as 'first output') in response to the enable signal being set HIGH.

The clock gating circuitry further includes a combination of a first flip-flop and an AND gate connected in series with the double synchronizer. The flip-flop and the AND gate individually receive the first output as an input. The flip-flop generates a second output in response to the first output, and transmits the second output as an input to the AND gate with an inversion, which in turn generates a third output by performing an AND operation using said first output and second output. In this case the third output is one pulse signal per cycle for every transformation of the enable signal from LOW to HIGH.

The clock gating circuitry further includes a second flip-flop connected in series with the AND gate. The second flip-flop receives the third output from the AND gate and generates a forth output, i.e., a (one cycle delayed pulse signal. The clock gating circuitry further includes an OR gate connected in series with the second flip-flop. The OR gate receives the third output and forth output as inputs thereto, and generates a fifth output by performing an OR operation on said third output and forth output, i.e., a two-pulse signal for every enable signal from LOW to HIGH.

The clock gating circuitry further includes a multiplexer connected in series with the double synchronizer, AND gate and OR gate respectively. The multiplexer creates a gated clock pattern based upon at least one of the first output, third output and fifth output received respectively from the double synchronizer, AND gate and OR gate. Further, the clock gating circuitry includes a gating element connected in series with the multiplexer and configured to generate a predetermined number of gated clock pulses based on the gated clock pattern created by the multiplexer, only when said enable signal is set HIGH.

The present disclosure envisages a method for designing a clock gating circuitry. The method in accordance with the present disclosure comprises the following steps:

incorporating into the clock gating circuitry, a double synchronizer responsive to at least a clock signal and an enable signal;
  configuring the double synchronizer to synchronize the enable signal with clock domain corresponding to gated clock signal, and generate a first output in response to at least the enable signal being set HIGH, the first output being a synchronized enable signal;
  connecting a combination of a first flip-flop and an AND gate with the double synchronizer, and providing the synchronized enable signal an input to the combination of the first flip-flop and the AND gate, and detecting a rising edge corresponding to the synchronized enable signal;
  configuring the combination of the first flip-flop and the AND gate to individually receive the first output, and further configuring the flip-flop to generate a second output in response to the first output, and configuring the AND gate to further receive the second output as an input thereto, and generate a third output by performing an AND operation using the first output and second output, and wherein the third output is one pulse signal per cycle for every transformation of the enable signal from LOW to HIGH;
  connecting a second flip-flop in series with the AND gate, and configuring the second flip-flop to receive the third output from the AND gate and generate a forth output, the forth output being a delayed pulse signal generated by delaying the third output by at least one cycle.
  connecting an OR gate in series with the second flip-flop and configuring the OR gate to receive at least the third output and forth output as inputs, and generating a fifth output by performing an OR operation utilizing the third output and forth output, the fifth output being a two-pulse signal per cycle for every transformation of the enable signal from LOW to HIGH;
  connecting a multiplexer in series with the double synchronizer, AND gate and OR gate, and creating a gated clock pattern using the multiplexer and based upon at least one of the first output, third output and fifth output received respectively from the double synchronizer, AND gate and OR gate; and
  connecting a gating element in series with the multiplexer, and generating a predetermined number of gated clock pulses based on the gated clock pattern created by the multiplexer when the enable signal is set to HIGH.

BRIEF DESCRIPTION OF THE DRAWINGS

The other objects, features and advantages will be apparent to those skilled in the art from the following description and the accompanying drawings in which.

DETAILED DESCRIPTION

Typically, the circuit of a conventional AND gate could be designed to function as a clock gating circuit. An AND gate incorporates two inputs, namely an Enable signal, and a clock signal. The output of the AND gate depends on both the Enable signal and the clock signal. Typically, the AND gate would function only when the Enable signal is HIGH, and when the Enable signal is LOW, the clock would be gated. Hence, typically by controlling the Enable input, the AND gate is designed to function as a clock gating circuit.

Figure 1:
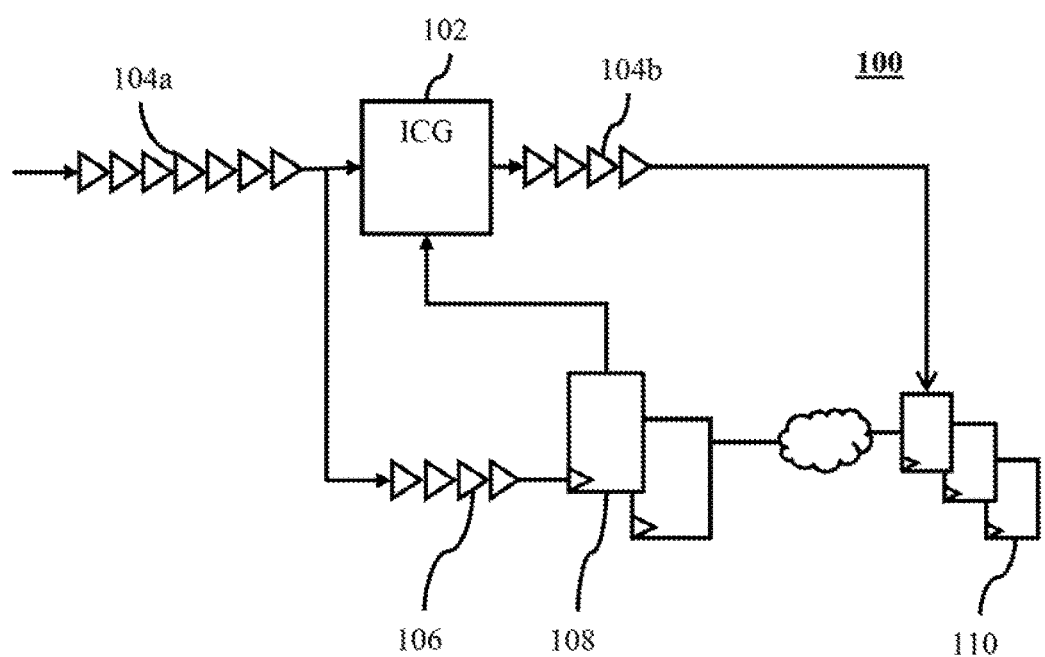
FIG. 1 is a circuit diagram illustrating a conventional clock gating circuitry in digital system.
Figure 2:
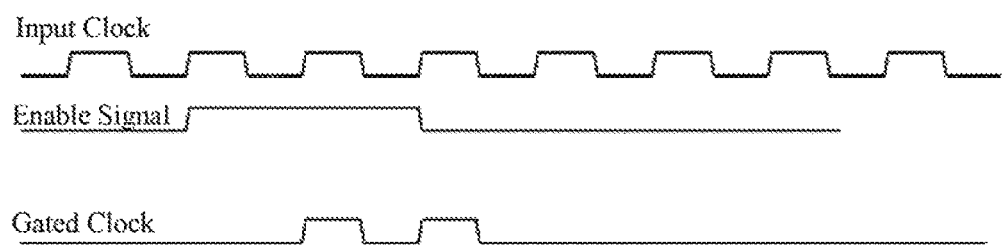
FIG. 2 is a timing diagram illustrating the theoretical set up time of 1 cycle required for driving the enable pin of the traditional clock gating circuit.
Figure 3:
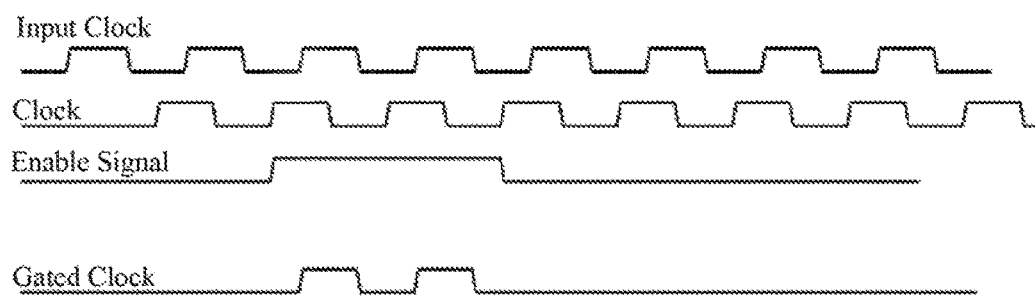
FIG. 3 is a timing diagram illustrating the reduced set up time, when the traditional clock gating circuit receives an early clock.

Referring to FIG. 1, there is shown a conventional (prior-art) clock network 100 of flip-flops driving an enable pin of the clock-gated circuit. As shown in FIG. 1, an integrated clock gating circuit 102 is used to reduce power consumption at the clock network by preventing individual flip-flops from switching between logic states when not in use. The integrated clock gating circuit 102 is selectively activated or inactivated based on design and implementation constraints corresponding to the clock network.

Referring again to FIG. 1, fan-outs 104a, 104b and 106 determine the number of gate inputs the flip-flops can feed or connect to. The fan-outs 104a, 104b and 106 decide how early in clock network the integrated clock gating circuit will be located, which intern decides the setup timing requirement at the enable input of the clock-gating circuit. The clock network 100 further includes a plurality of flip-flops (collectively represented by) 108 and 110. Accordingly, the clock gating circuit 102 receives the early clock with respect to the flip-flops 108 and 110. Disadvantage of the traditional clock-gating circuit is that the setup time requirement would be difficult to achieve due to large clock skew between the launch flip-flops 108, 110 and enable pin of 102.

Figure 4:
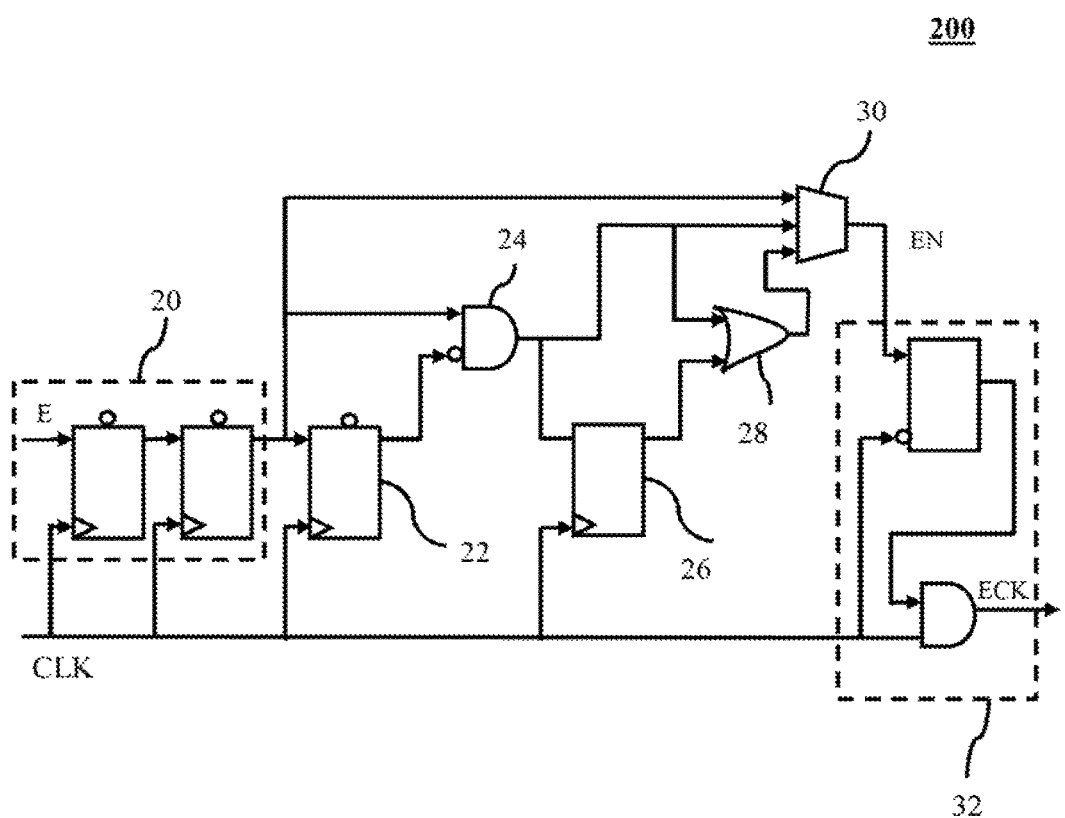
FIG. 4 is a circuit diagram illustrating an asynchronous clock gating circuitry, in accordance with the present disclosure.

Therefore, in order to overcome the drawbacks discussed hitherto, the present disclosure envisages a multi utility asynchronous clock gating circuitry. Referring to FIG. 4, there is shown a circuit diagram corresponding to the multi utility asynchronous clock gating circuitry 200. The asynchronous clock gating circuitry envisaged by the present disclosure includes a double synchronizer denoted by reference numeral 20. The double synchronizer 20 is responsive to a clock signal and an enable signal. The double synchronizer 20 prevents the propagation of metastable state to the downstream logic from the output of a flip-flop, when setup/hold time in not met at the input of the flip-flop. The setup time is defined as the timing window before the active clock edge where the data is not allowed to change, and Hold time is the timing window after the active clock edge till (the expiry of) which data is not allowed to change. The double synchronizer 20 is configured to synchronize the enable signal with clock domain (corresponding to a gated clock signal), and generate a first output in response to at least the enable signal being set HIGH. The first output generated by the double synchronizer is typically a synchronized enable signal.

In accordance with the present disclosure, a combination of a first flip-flop 22 and an AND gate 24 is connected in series with the double synchronizer 20. The flip-flop 22 and the AND gate 24 receive the first output (synchronized enable signal) as an input. As a response to the synchronized enable signal, the first flip-flop 22 generates a second output by detecting the raising edge of the synchronized enable signal. Subsequently, the AND gate 24 receives the first output (synchronized enable signal) and the second output (the rising edge of the synchronized enable signal). The AND gate 24 performs an AND operation using the first output and second output. Typically, the output (third output) of the AND operation is one pulse signal per cycle for every transformation of the synchronized enable signal from LOW to HIGH. The first flip-flop 22 and the AND gate 24, in combination, detect a rising edge of the synchronized enable signal generated by the double synchronizer 20.

In accordance with the present disclosure, a second flip-flop 26 is connected in series with the AND gate 24. The second flip-flop 26 receives the third output (one pulse signal per cycle) from the AND gate 24 as an input and subsequently generates a delayed pulse signal (two-pulse signal per cycle) as a forth output. An OR gate 28 is connected in series with the second flip-flop 26. The OR gate 28 receives the third output (one pulse signal per cycle) from the AND gate 24 and the forth output (delayed pulse signal) from the second flip-flop 26. The second flip-flop 26 is configured to generate a delayed pulse signal by delaying the rising edge of the synchronized enable signal by at least cine clock cycle. Subsequently, the OR gate 28 generates a fifth output by performing an OR operation using the third output and the forth output. The fifth output generated by the OR gate 28 is a two-pulse signal per cycle.

In accordance with the present disclosure, the multi utility asynchronous clock gating circuitry 200 further includes a multiplexer 30 connected in series with the double synchronizer 20, AND gate 24, and OR gate 28. The multiplexer 30 is configured to create gated clock pattern selectively based upon at least one of the first output, third output and fifth output received respectively from the double synchronizer 20, AND gate 24 and OR gate 28.

In accordance with the present disclosure, the multiplexer 30 is configured to selectively receive the synchronized enable signal from the double synchronizer 20 as an input or the one pulse signal per cycle as an input from the AND gate 24, or the two-pulse signal per cycle as an input from the OR gate 28. Subsequently, the multiplexer 30 generates a continuous gated clock pattern if it receives the synchronized enable signal as the input from the double synchronizer 20. Alternatively, the multiplexer 30 generates a gated clock pattern with one cycle in response to receiving the one pulse signal per cycle received from the AND gate 24. Alternatively, the multiplexer 30 generates a gated clock pattern with two cycle, as a response to receiving the two-pulse signals per cycle as the input from the OR gate 28.

Figure 6:
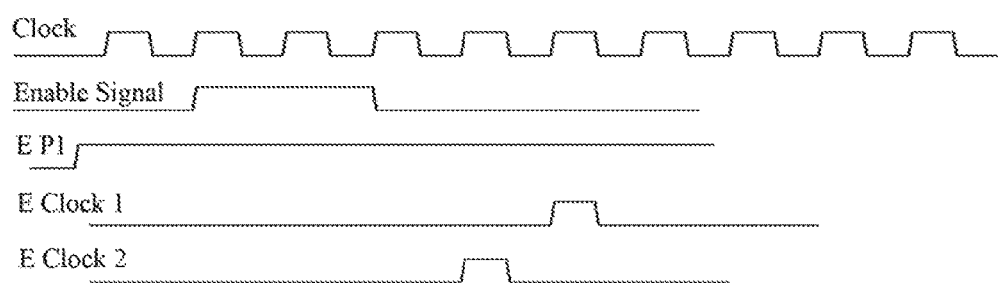
FIG. 6 is a timing diagram illustrating the uncertainty in generating the gated clock in accordance with the present disclosure.

In accordance with the present disclosure, the asynchronous clock gating circuitry 200 further includes a gating element 32 connected in series with the multiplexer 30. The gating element 30 is configured to generate a predetermined number of gated clock pulses based on the gated clock pattern created by the multiplexer 30. The gating element 32 generates the gated clock pulses (as shown in FIG. 6) with one cycle of uncertainty only when the enable signal is set to HIGH.

Figure 5:
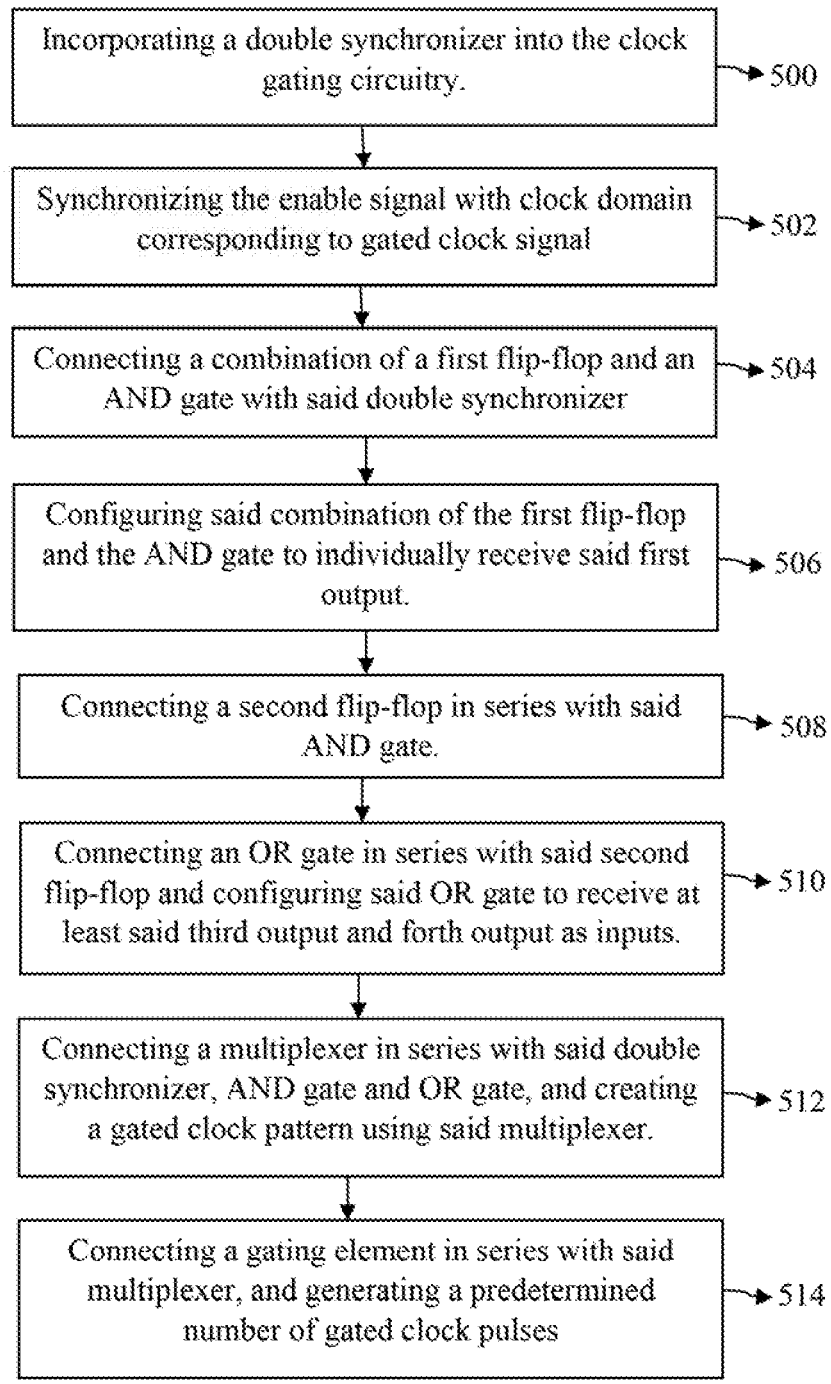
FIG. 5 is a flow chart illustrating the steps involved in the method for designing an asynchronous clock gating circuitry.

Referring to FIG. 5, there is shown a flowchart illustrating the steps involved in the method for designing a clock gating circuitry. At step 500, a double synchronizer is incorporated into the clock gating circuitry. The double synchronizer is responsive to at least a clock signal and an enable signal. At step 502, the double synchronizer is configured to synchronize the enable signal with clock domain corresponding to gated clock signal. Subsequently, the double synchronizer generates a first output in the form of a synchronized enable signal in response to the enable signal being set HIGH.

At step 504, a combination of a first flip-flop and an AND gate is connected in series with the double synchronizer. The synchronized enable signal is provided as an input to the combination of the first flip-flop and the AND gate. At step 506, the first flip-flop and the AND gate individually receive the first output. Subsequently, the first flip-flop generates a second output in response to the first output, by detecting a raising edge of the synchronized enable signal. At step 506, the AND gate is configured to receive the second output from the first flip-flop, and generate a third output by performing an AND operation on the first output and second output. The third output generated by the AND gate is a one pulse per cycle signal for every transformation of the enable signal from LOW to HIGH.

At step 508, a second flip-flop is connected in series with the AND gate. The second flip-flop receives the third output (one pulse per cycle signal) from the AND gate and subsequently generates a forth output, the forth output being a delayed pulse signal generated by delaying the third output by at least one cycle. At step 510, an OR gate is connected in series with the second flip-flop. The OR gate receives both the third output and the forth output, and subsequently generates a fifth output by performing an OR operation on the third output and forth output. The fifth output is a two-pulse per cycle signal for every transformation of the enable signal front LOW to HIGH.

At step 512, a multiplexer is connected in series with the double synchronizer, the AND gate and the OR gate respectively. The multiplexer subsequently creates a gated clock pattern based upon at least one of the first output, third output and fifth output received respectively from the double synchronizer, AND gate and OR gate. At step 514, a gating element is connected in series with the multiplexer, and a predetermined number of gated clock pulses are generated by the gating element based on the gated clock pattern created by the multiplexer, when the enable signal is set to HIGH.

In accordance with the present disclosure, the step of configuring the second flip-flop to receive the third output from the AND gate and generate a forth output, the forth output being a delayed pulse, further includes the step of delaying the rising edge corresponding to the synchronized enable signal by one clock cycle.

In accordance with the present disclosure, the step of configuring the OR gate to generate a fifth output by performing an OR operation utilizing the third output and forth output, further includes the step of performing a logical OR operation on the one pulse signal and the pulse signal.

In accordance with the present disclosure, the step of connecting a multiplexer in series with the double synchronizer, AND gate and OR gate, further includes the following steps: selectively receiving at the multiplexer, the synchronized enable signal from the double synchronizer, as an input; selectively receiving at the multiplexer, the one pulse signal per cycle from the AND gate, as an input; and selectively receiving at the multiplexer, the two-pulse signals per cycle from the OR gate as an input.

In accordance with the present disclosure, the step of creating a gated clock pattern using the multiplexer further includes the step of generating a gated clock pattern selected from the group consisting of a continuous gated clock pattern, gated clock pattern with one cycle, and gated clock pattern with two cycle.

In accordance with the present disclosure, the step of creating a gated clock pattern using the multiplexer further includes: generating the continuous gated clock pattern in response to the synchronized enable signal received front the double synchronizer; generating the gated clock pattern with one cycle in response to the one pulse signal per cycle received from the AND gate; and generating the gated clock pattern with two cycle in response to the two-pulse signals per cycle received from the OR gate.

The foregoing description of the specific embodiments will so fully reveal the general nature of the embodiments herein that others can, by applying current knowledge, readily modify and/or adapt for various applications such embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments herein can be practiced with modifications.

The technical advantages envisaged by the present disclosure include the realization of an asynchronous clock gating circuitry and a method for designing the asynchronous clock gating circuitry. The multi-utility asynchronous dock gating circuitry could be placed at the very beginning of the clock network, given its design and implementation logic. The multi-utility asynchronous clock gating circuitry helps meet the timing requirement on the enable pin thereof. The multi-utility asynchronous clock gating circuitry avoids cumbersome replication of clock gating circuitry during physical implementation of the (circuit) design, and further helps reduce the power consumption levels in sequential circuits.

What is claimed is:

1. A method of designing a clock gating circuitry, said method comprising the following steps:
    incorporating into the clock gating circuitry, a double synchronizer responsive to at least a clock signal and an enable signal;
    configuring said double synchronizer to synchronize the enable signal with clock domain corresponding to gated clock signal, and generate a First output in response to at least said enable signal being set HIGH, said first output being a synchronized enable signal;
    connecting a combination of a first flip-flop and an AND gate with said double synchronizer, and providing said synchronized enable signal an input to the combination of said first flip-flop and said AND gate, and detecting a rising edge corresponding to said synchronized enable signal;
    configuring said combination of the first flip-flop and the AND gate to individually receive said first output, and further configuring said flip-flop to generate a second output in response to said first output, said second output being the rising edge corresponding to said synchronized enable signal, and configuring said AND gate to further receive said second output as an input thereto, and generate a third output by performing an AND operation using said first output and second output, and wherein said third output is one pulse signal per cycle for every transformation of the enable signal from LOW to HIGH;
    connecting a second flip-flop in series with said AND gate, and configuring said second flip-flop to receive said third output from said AND gate and generate a forth output, said forth output being a delayed pulse signal generated by delaying said third output by at least one cycle
    connecting an OR gate in series with said second flip-flop and configuring said OR gate to receive at least said third output and forth output as inputs, and generating a fifth output by performing an OR operation utilizing said third output and forth output, said fifth output being a two pulse signal per cycle for every transformation of the enable signal from LOW to HIGH;
    connecting a multiplexer in series with said double synchronizer, AND gate and OR gate, and creating a gated clock pattern using said multiplexer and based upon at least one of said first output, third output and fifth output received respectively from said double synchronizer, AND gate and OR gate; and
    connecting a gating element in series with said multiplexer, and generating a predetermined number of gated clock pulses based on the gated clock pattern created by said multiplexer when said enable signal is set HIGH.

2. The method as claimed in claim 1, wherein the step of configuring said second flip-flop to receive said third output from said AND gate and generate a forth output, said forth output being a delayed pulse, further includes the step of delaying the rising edge corresponding to the synchronized enable signal by one clock cycle.

3. The method as claimed in claim 1, wherein the step of configuring said OR gate to generate a fifth output by performing an OR operation utilizing said third output and forth output, further includes the step of performing a logical OR operation on the one pulse signal and the pulse signal.

4. The method as claimed in claim 1, wherein the step of connecting a multiplexer in series with said double synchronizer, AND gate and OR gate, and creating a gated clock pattern using said multiplexer and based upon at least one of said first Output, third output and fifth output received respectively from said double synchronizer, AND gate and OR gate further includes the following steps:
    selectively receiving at the multiplexer, the synchronized enable signal from said double synchronizer, as an input, and generating a continuous gated clock pattern in response to said synchronized enable signal;
    selectively receiving at the multiplexer, the one pulse signal per cycle from said AND gate, as an input, and generating a gated clock pattern with one cycle, in response to said one pulse signal per cycle; and
    selectively receiving at the multiplexer, the two pulse signals per cycle from said OR gate, as an input, and generating a gated clock pattern with two cycle, in response to said two pulse signals per cycle.

5. A clock gating circuitry, said circuit comprising:
a double synchronizer responsive to at least a clock signal and an enable signal, said double synchronizer configured to synchronize the enable signal with clock domain corresponding to a gated clock signal, and generate a first output in response to at least said enable signal being set HIGH, said first output being a synchronized enable signal;

a combination of a first flip-flop and an AND gate, said combination connected in series with said double synchronizer, said flip-flop and said AND gate configured to individually receive said first output as an input thereto, said flip-flop configured to generate a second output in response to said first output, said second output being a rising edge corresponding to said synchronized enable signal, said AND gate configured to receive said second output as an input thereto, and generate a third output by performing an AND operation using said first output and second output, and wherein said third output is one pulse signal per cycle for every transformation of the enable signal from LOW to HIGH;

a second flip-flop connected in series with said AND gate, said second flip-flop configured to receive said third output from said AND gate and generate a forth output, said forth output being a delayed pulse signal;

an OR gate connected in series with said second flip-flop, said OR gate configured to receive at least said third output and forth output as inputs, said OR gate configured to generate a fifth output by performing an OR operation on said third output and forth output, said fifth output being a two pulse signal per cycle;

a multiplexer connected in series with said double synchronizer, AND gate and OR gate respectively, said multiplexer configured to create a gated clock pattern based upon at least one of said first output, third output and fifth output received respectively from said double synchronizer, AND gate and OR gate; and a gating element connected in series with said multiplexer, said gating element configured to generate a predetermined number of gated clock pulses based on the gated clock pattern created by said multiplexer, only when said enable signal is set HIGH.

6. The clock gating circuitry as claimed in claim 5, wherein said first flip-flop and said AND gate are connected in series, and wherein said combination of the first flip-flop and the AND gate is configured to detect a rising edge corresponding to the synchronized enable signal.

7. The clock gating circuitry as claimed in claim 5, wherein said second flip-flop is configured to generate the delayed pulse by delaying the rising edge corresponding to synchronized enable signal by one clock cycle.

8. The clock gating circuitry as claimed in claim 5, wherein said multiplexer is configured to selectively receive the synchronized enable signal from said double synchronizer as an input, said multiplexer further configured to selectively receive said one pulse signal per cycle as an input from said AND gate, said multiplexer still further configured to receive said two pulse signals per cycle as an input from said OR gate.

9. The clock gating circuitry as claimed in claim 5, wherein said multiplexer is further configured to generate a continuous gated clock pattern in response to said synchronized enable signal received from said double synchronizer, said multiplexer still further configured to generate a gated clock pattern with one cycle in response to said one pulse signal per cycle received from said AND gate, said multiplexer still further configured to generate a gated clock pattern with two cycle in response to said two pulse signals per cycle received from said OR gate.

* * * * *